United States Patent
You (10) Patent No.: US 8,022,688 B2
(45) Date of Patent: Sep. 20, 2011

(54) RF POWER DETECTOR

(75) Inventor: Zhong You, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 111 days.

(21) Appl. No.: 12/366,734

(22) Filed: Feb. 6, 2009

(65) Prior Publication Data

US 2010/0201346 A1    Aug. 12, 2010

(51) Int. Cl.
*G01R 17/00* (2006.01)
(52) U.S. Cl. .................................. 324/123 C
(58) Field of Classification Search ............ None
See application file for complete search history.

(56) References Cited

U.S. PATENT DOCUMENTS

| | | | |
|---|---|---|---|
| 6,917,245 B2 | 7/2005 | Dupuis et al. | |
| 6,924,698 B2 * | 8/2005 | Camnitz et al. | 330/140 |
| 7,164,315 B2 | 1/2007 | Camnitz et al. | |
| 7,348,853 B2 * | 3/2008 | Camnitz et al. | 330/285 |
| 2005/0024137 A1 * | 2/2005 | Camnitz et al. | 330/140 |
| 2005/0168211 A1 * | 8/2005 | Camnitz et al. | 324/142 |

* cited by examiner

*Primary Examiner* — Jermele M Hollington
(74) *Attorney, Agent, or Firm* — Zagorin O'Brien Graham LLP (57) ABSTRACT

Real power delivered to a load in an RF transmit path is measured. Measuring the real power includes supplying a first voltage from a first side of a passive network disposed between the power amplifier and the load, supplying a second voltage from a second side of the passive network; and using the first and second voltages and a phase delayed voltage to determine the real power delivered to the load. A voltage difference between the first and second voltages is determined and multiplied by the phase shifted voltage. A low pass filter is then applied to the output of the multiplier to provide an indication of the real power consumed by the load. The indication of real power consumed may then be used to control the power amplifier.

20 Claims, 13 Drawing Sheets

RF POWER DETECTOR

CROSS-REFERENCE TO RELATED APPLICATION(S)

BACKGROUND

1. Field of the Invention

This following invention relates to power detectors such as those used for wireless applications.

2. Description of the Related Art

Radio frequency (RF) power amplifiers (PAs) are commonly used within the transmit path for wireless applications to boost the transmitted power provided to the antenna. They are typically designed to provide power into a fixed impedance load, such as 50 ohms, and are designed to operate from a fixed supply voltage, such as 3.5V. At its output, the power amplifier (PA) has an output network that is formed from passive components, such as inductors, capacitors, and transformers that are arranged in a tuned configuration. The networks formed from these passive elements are resonant at frequencies near that of the desired radio frequency (RF) carrier. Within this narrow frequency range, the circuit provides impedance transformation. Without impedance transformation, the maximum power that could be delivered by the power amplifier to a fixed load would be limited by the amplifier's supply voltage. With impedance transformation, the power amplifier can provide an output power that is higher than this limit.

Figure 1:
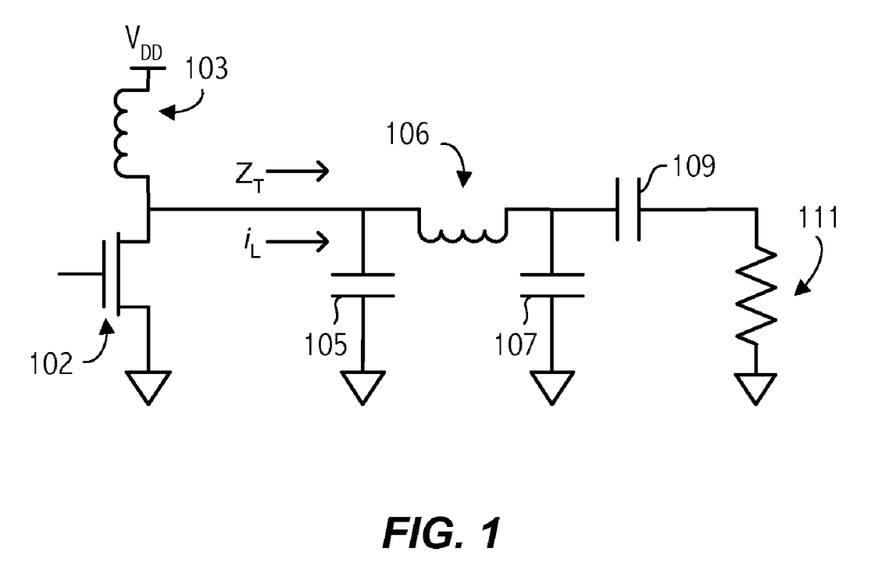
FIG. 1 shows an example of an RF power amplifier and associated output network that are well known in the field.

FIG. 1 shows an example of an RF power amplifier and associated output network that are well known in the field. The amplifier's final stage is formed from transistor 102 and inductor 103. Capacitor 109 acts as a DC blocking element and elements 105, 106, and 107 perform impedance transformation, transforming the load impedance 111 from its actual value, $R_L$, to new impedance, $Z_T$, seen by the final PA stage. The ratio $R_L/Z_T$ is referred to as the transformation ratio. The load impedance $R_L$ is usually purely real. Components in the amplifier's output network are usually chosen so that $Z_T$ is strictly real as well.

Figure 2:
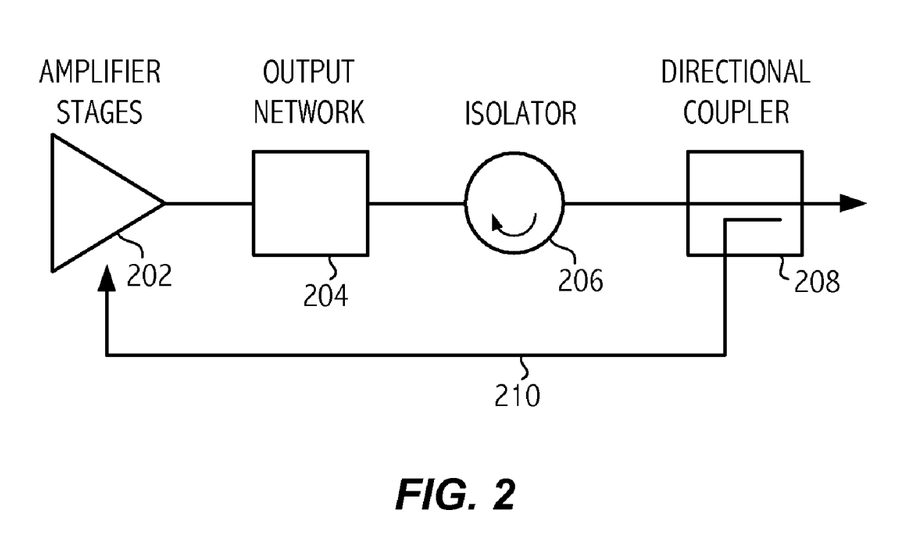
FIG. 2 shows an example of a common transmit chain for wireless transmitters.

FIG. 2 shows an example of a common transmit chain for wireless transmitters. The PA's amplification stages, 202, are followed by an output network, 204, which is followed by an isolator, 206, and then a directional coupler, 208. An isolator is a passive device that provides the PA with a more controlled load impedance despite large variations in antenna impedance. The directional coupler 208 generates an output signal, 210, that represents the level of power being transmitted to the antenna. This measure is fed back to the amplifier stages where it is used to control power levels being generated. In some cases, the purpose of this loop is to reduce variations in transmitted power from device to device and over conditions such as temperature. In other cases, this loop is used to assure that the maximum power provided to the antenna remains below a maximum limit as set by safety considerations.

RF systems have in the past measured forward power of an amplifier. For example, as shown in FIG. 2, the directional coupler 208 may be placed between the power amplifier and the load and the forward power supplied by the power amplifier is measured and used to control a gain of the power amplifier. However, the forward power value does not equate to the real power consumed by the load.

Thus, the power at the load can be an important criterion in controlling amplifier output.

SUMMARY

Accordingly, an embodiment of the invention provides a method that includes measuring real power delivered to a load in an RF transmit path and utilizing the measured real power to adjust a power amplifier in the RF transmit path. Measuring the real power may further include supplying a first voltage from a first side of a passive network disposed between the power amplifier and the load; supplying a second voltage from a second side of the passive network; and using the first and second voltages and a phase delayed voltage to determine the real power delivered to the load. Determining the real power may further include determining a voltage difference between the first and second voltages and determining a multiplication result of the voltage difference multiplied by the phase shifted third voltage.

In another embodiment, an apparatus includes one or more passive networks disposed between a power amplifier and the load in an RF transmit path. A real power detector is coupled to utilize a first voltage present on a first side of the one or more passive networks with respect to the power amplifier, and a second voltage present on a second side of the one or more passive networks with respect to the power amplifier, and a phase delayed voltage, to determine the real power consumed by the load. The phase delayed voltage may be derived from one of the first and second voltages or a separate voltage. The apparatus may further include a difference circuit to determine a voltage difference between the first and second voltages and a circuit to determine a multiplication result of the voltage difference multiplied by the phase shifted voltage. The apparatus may further include a low pass filter to filter the multiplication result and supply the real power consumed by the load.

In another embodiment, a method is provided that includes supplying a first voltage present on a first side of a passive network disposed between the power amplifier and a load in an RF transmit path to a power detector circuit and supplying a second voltage present on a second side of the passive network to the power detector circuit, and determining a voltage difference between the first and second voltages. A voltage is phase shifted to provide a phase shifted voltage, which is then multiplied by the voltage difference between the first and second voltages.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 3:
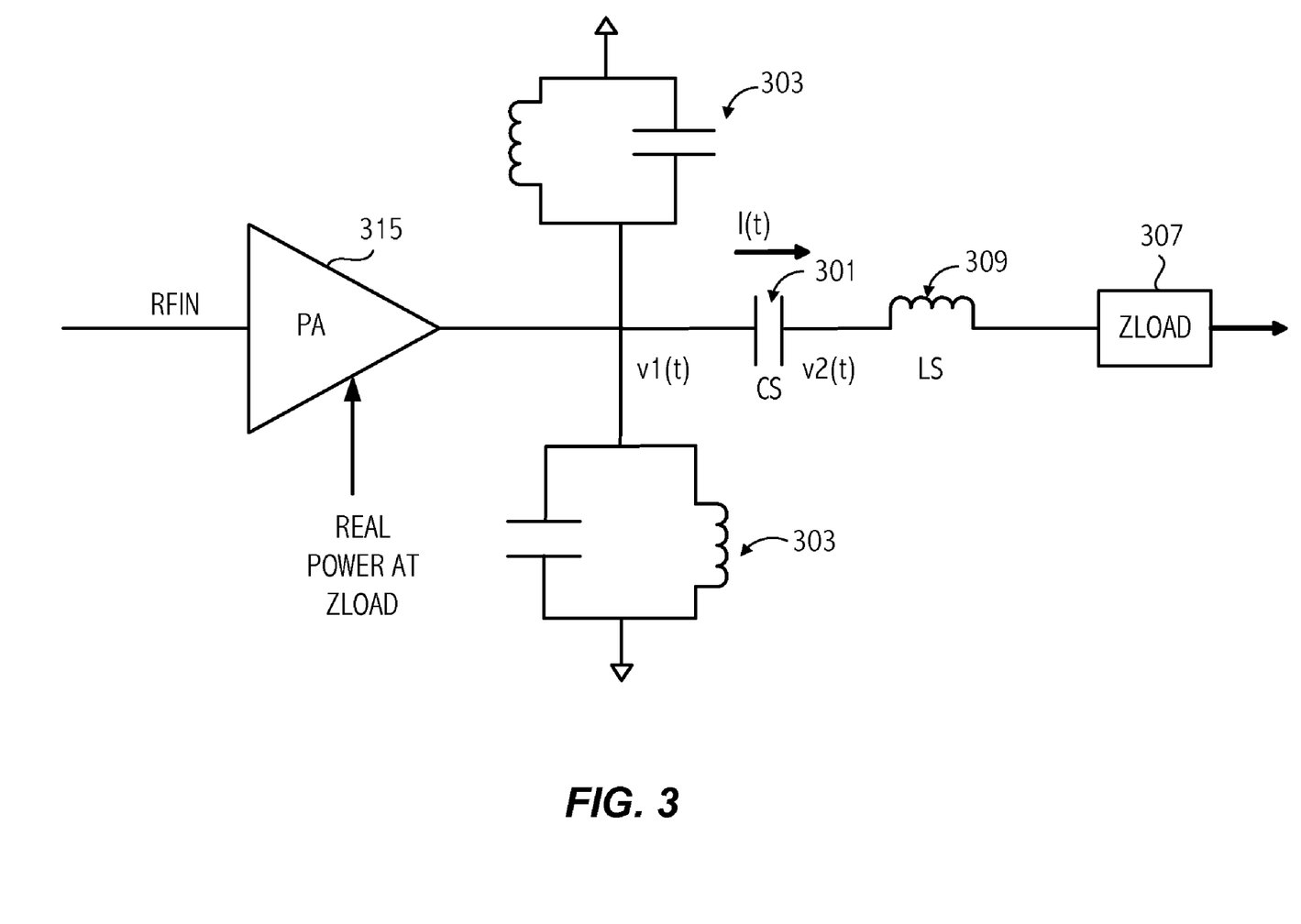
FIG. 3 illustrates an exemplary power amplifier illustrating the methodology of determining real power according to an embodiment of the present invention.

A methodology to determine the real power consumed by the load according to an embodiment of the invention is illustrated in FIG. 3, which shows a portion of an RF integrated circuit that includes the DC blocking capacitor 301 at the output of the BALUN 303. The real power consumed by the real part of the load 307 is the average of v1(t)*I(t). All the information needed to determine the real power consumed by the load is in v1(t) and v2(t), which is accessible on the RF integrated circuit. Note that CS 301 and LS 309 can be any reactive lossless network.

Figure 4:
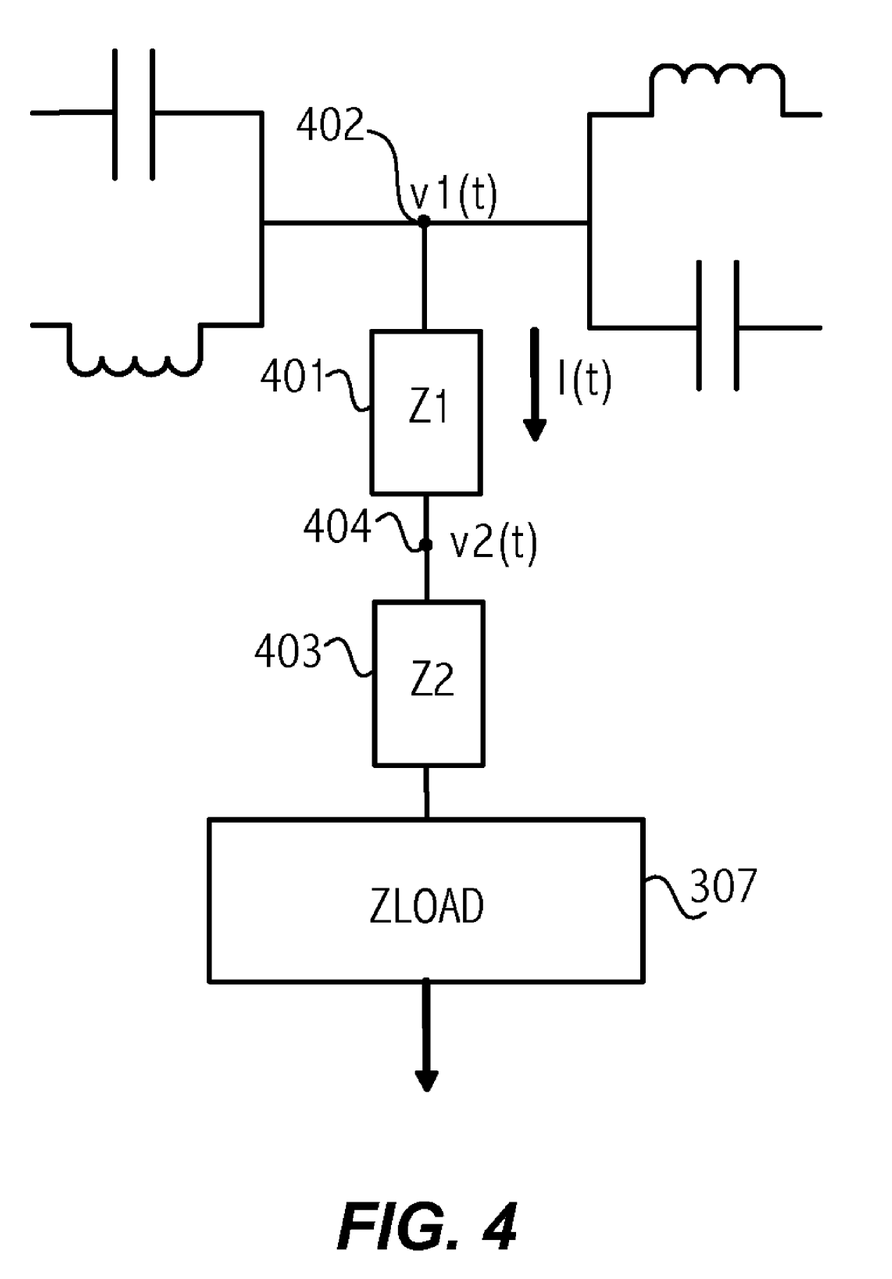
FIG. 4 illustrates generic reactive networks and the methodology of determining real power according to an embodiment of the present invention.

Referring now to FIG. 4, generic reactive networks 401 and 403 are shown. The current I(t) passes through nodes 402 and 404. The voltage at node 402 is v1(t) and at node 404 is v2(t). The average of v1(t)*I(t) is the same as v2(t)*I(t) since there is no power loss at reactive networks Z1 or Z2. The average of v1(t)*I(t) is the real power consumed at ZLOAD 307. Real power is the power consumed by the resistive part (real part) of ZLOAD. Note that I(t) has a 90 degree phase relation with v2(t)−v1(t). Note that Z2 can just be a short. V1(t) and I(t) can be defined as follows:

$$v1(t) = \sin(\omega t) \text{ and} \quad (1)$$

$$I(t) = \sin(\omega t + \phi) \quad (2)$$

where $\omega$ is the carrier frequency and $\phi$ is the phase angle between current and voltage.
So the real power is the average of $$v1(t)*I(t) = 1/2 \cos(\phi). \quad (3)$$

Referring to FIGS. 3 and 4, $$\frac{d}{dt}(v1 - v2) = \frac{I(t)}{C}, \text{ so} \quad (4)$$

$$v1 - v2 = \int \frac{I(t)}{C} dt = -\frac{1}{\omega C}\cos(\omega t + \phi). \quad (5)$$

Figure 5:
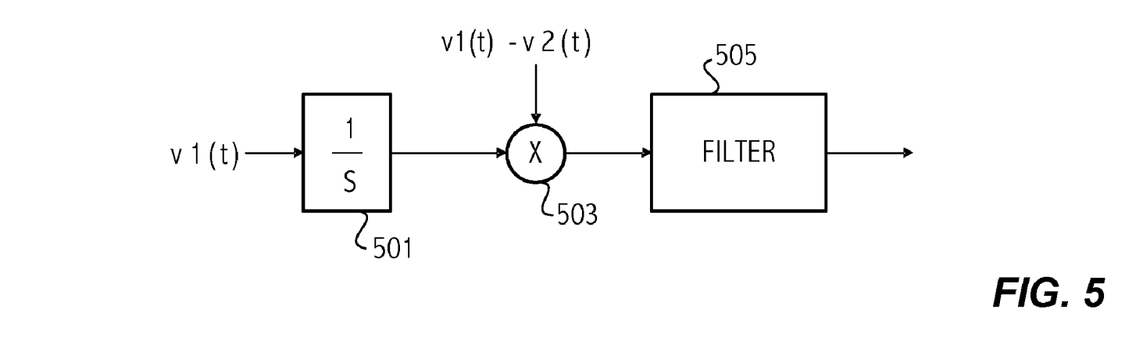
FIG. 5 illustrates a high level block diagram illustrating aspects of an embodiment of the invention.

So (v1−v2) is a 90 degree delayed version of I(t). The real power can be calculated if v1(t) is phase delayed by 90 degrees or advanced by 90 degrees so it properly aligns with v1−v2 (the phase delayed version of I(t)). Referring to FIG. 5, that can be accomplished by passing v1(t) through an integrator 501 to provide the desired 90 degree phase shift. So, the voltage v1(t) is passed through integrator 501 (or a differentiator) and multiplied in multiplier 503 with the difference (v1−v2) of voltages v1 and v2 to give:

$$\frac{1}{\omega^2 C}\cos(2\omega t + \phi) + \frac{1}{\omega^2 C}\cos(\phi) \quad (6)$$

The first term in equation 6 is a high frequency portion and the second term reflects the real power consumed by the load. So passing the multiplication value through the low pass filter 505 filters out the first term and so provides the real power.

If v1−v2 is across an inductive impedance L instead of C, $$(v1 - v2) = L\frac{dI}{dt} = L\omega\cos(\omega t + \phi). \quad (7)$$

Integrating v1 we obtain $$\frac{1}{\omega}\cos(\omega t) \quad (8)$$

Multiplying (7) and (8), we obtain $$L \cos(2\omega t + \phi) + L \cos(\phi). \quad (9)$$

The first term represents the high frequency component that can be filtered out by a low pass filter.

Figure 6:
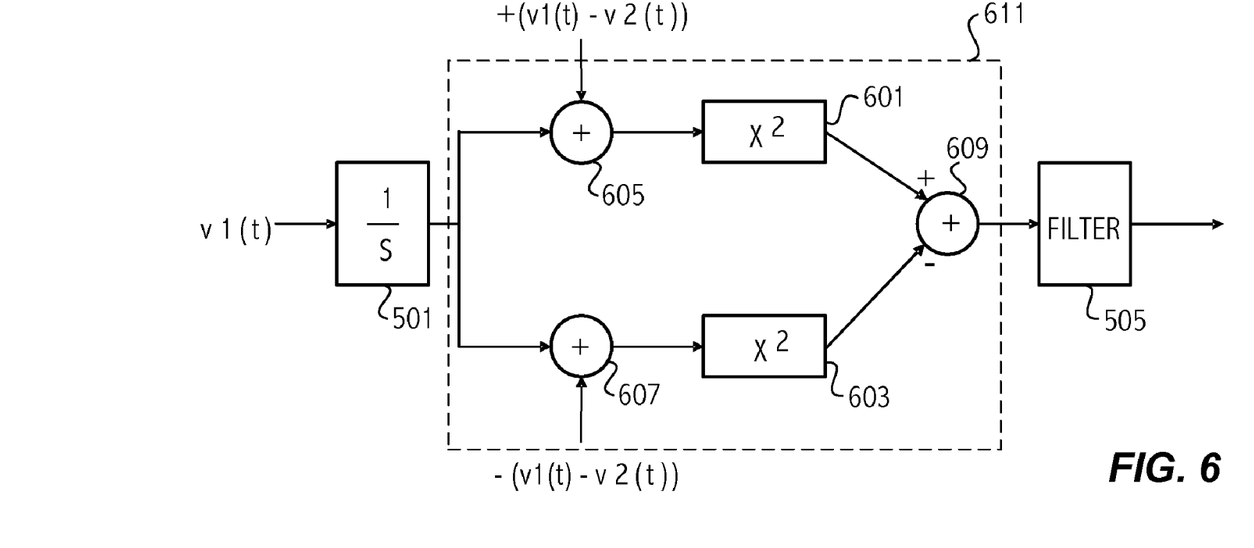
FIG. 6 illustrates an alternative approach to obtaining the multiplication result, using RMS detectors.

Referring to FIG. 6, it can be hard to build a true RF multiplier, so in an alternative approach to obtain the multiplication result, two RMS detectors 601 and 603 are used, which can be easier to implement. As shown in FIG. 6, the value (v1(t)−v2(t)) is summed with the phase delayed v1 in summer 605 and then provided to RMS detector 601. In summer 607, (v2(t)−v1(t)) is summed with the phased delayed v1 and provided to RMS detector 603. The values from the RMS detectors are then subtracted in summer 609 to provide the multiplication result, which is then supplied to low pass filter 505. Thus, block 611 provides the multiply function of multiplier 503 in FIG. 5 as shown in equation 10 below:

$$(v1\_delayed+(v1-v2))^2-(v1\_delayed-(v1-v2))^2= \\ 4*v1\_delayed*(v1-v2). \quad (10)$$

The output from block 611 can be scaled appropriately to obtain the desired multiplication result v1_delayed*(v1−v2) without the fixed gain term of four.

Figure 7:
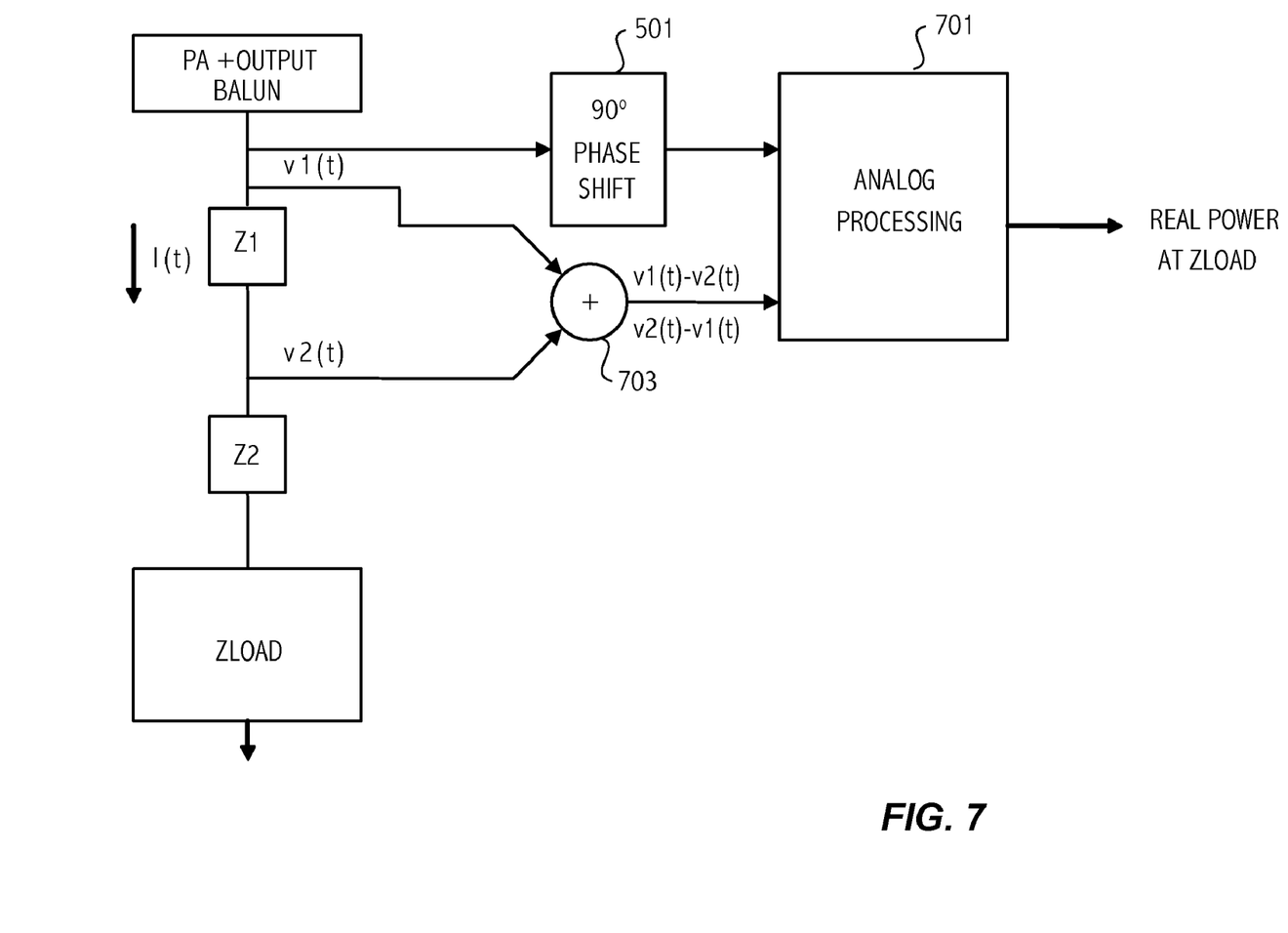
FIG. 7 illustrates an option for selection of the phase delayed voltage according to an embodiment of the invention.
Figure 8:
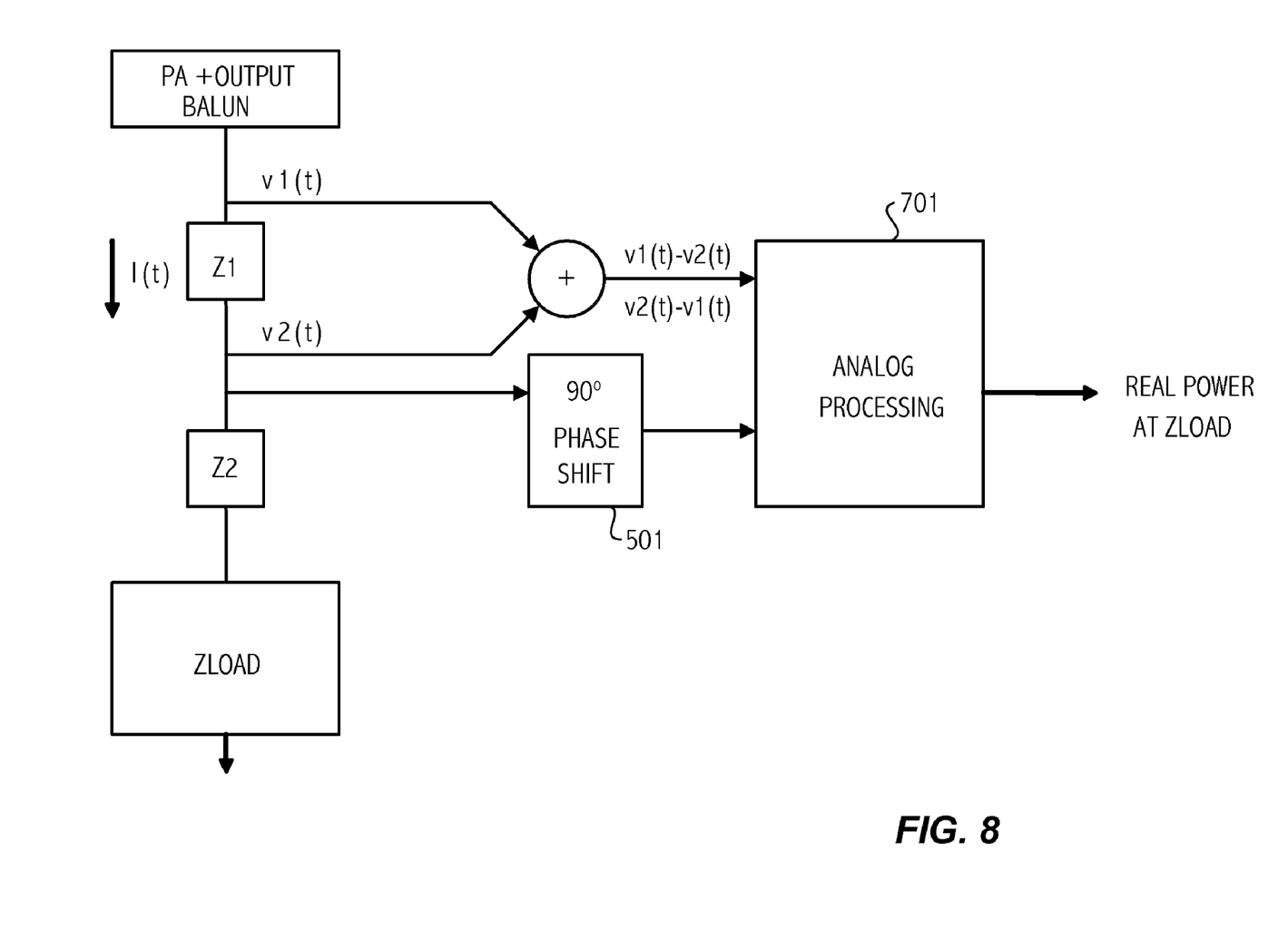
FIG. 8 illustrates an option for selection of the phase delayed voltage according to an embodiment of the invention.
Figure 9:
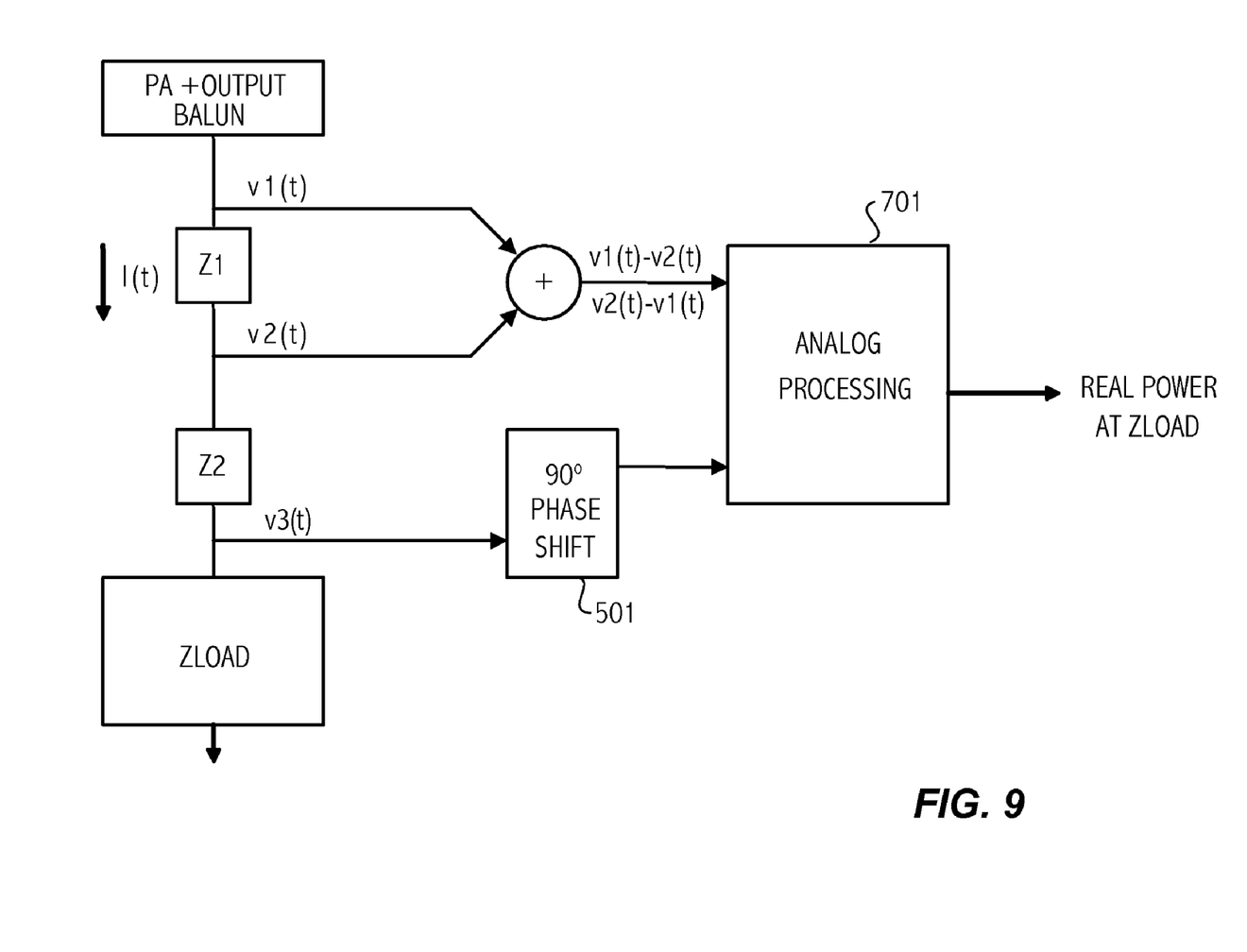
FIG. 9 illustrates an option for selection of the phase delayed voltage and the two other voltages used in determination of real power consumed by the load according to an embodiment of the invention.

While the phase delayed voltage shown in FIGS. 3-6 was assumed to be v1, in fact, the choice for the phase delayed voltage can be flexible and can be any of the sampled voltages shown in FIGS. 7-15. FIG. 7 shows the voltage v1(t) being supplied to phase shift block 501 and subsequently to analog processing block 701, which performs the functions shown in blocks 611 and 505 in FIG. 6. Note that the figure is simplified in that the summer 703 provides both the positive and negative values for v1(t)−v2(t). As shown in FIG. 8, the real power calculation can also utilize v2(t) for the phase shifted voltage. FIG. 9 shows the phase shifted voltage can be selected as v(3) at the load side of the second network Z2.

Figure 10:
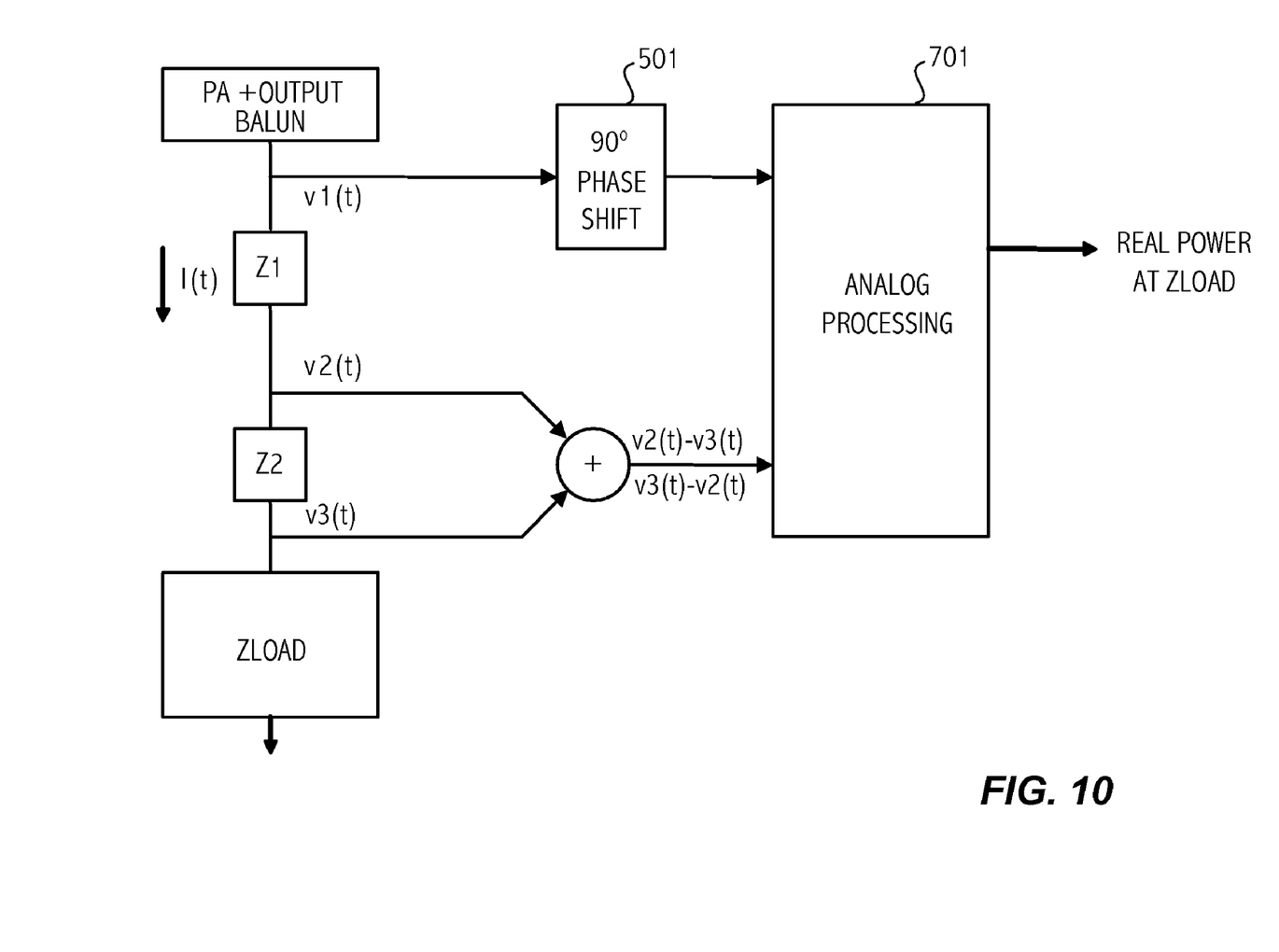
FIG. 10 illustrates an option for selection of the phase delayed voltage and the two other voltages used in determination of real power consumed by the load according to an embodiment of the invention.
Figure 11:
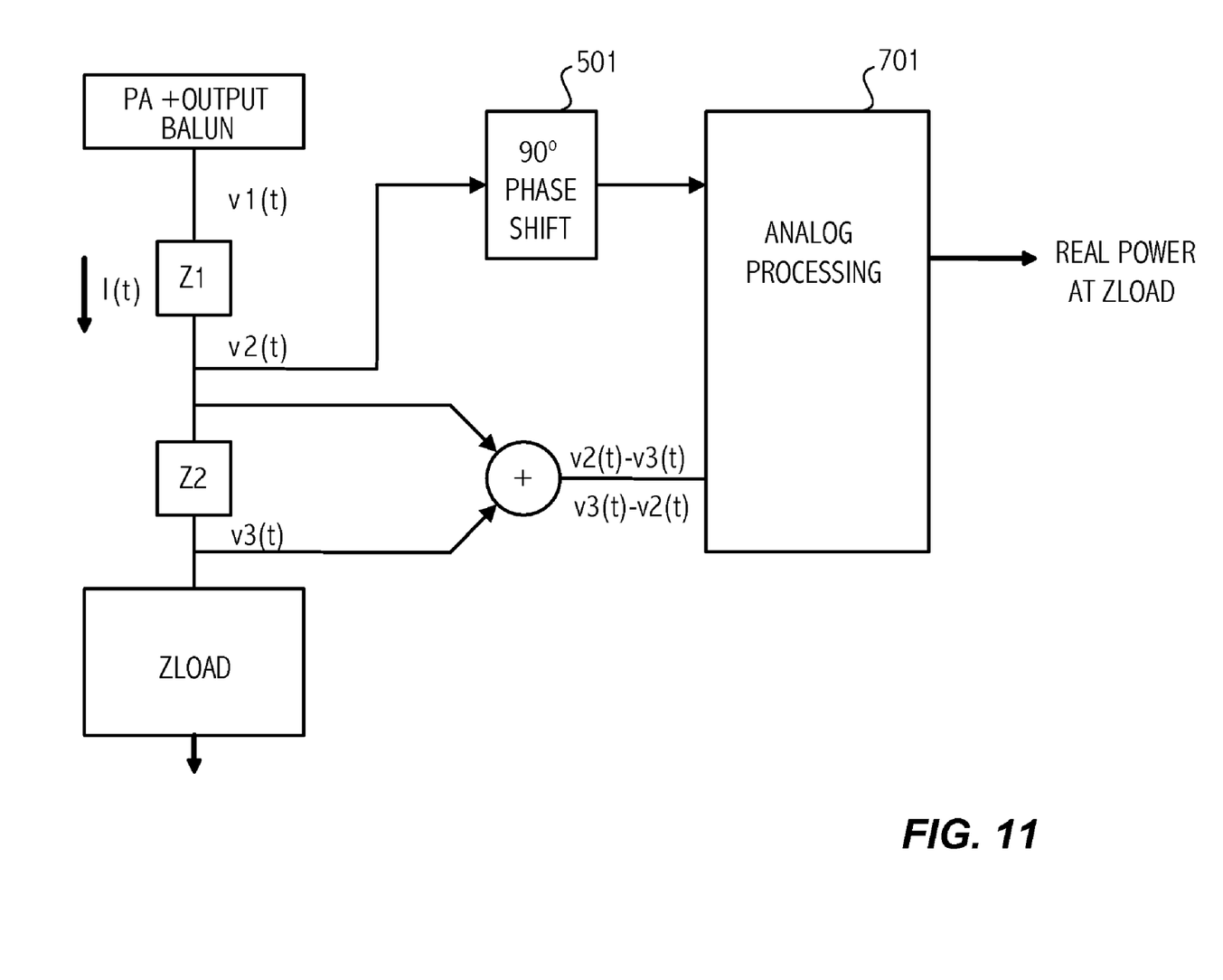
FIG. 11 illustrates an option for selection of the phase delayed voltage and the two other voltages used in determination of real power consumed by the load according to an embodiment of the invention.
Figure 12:
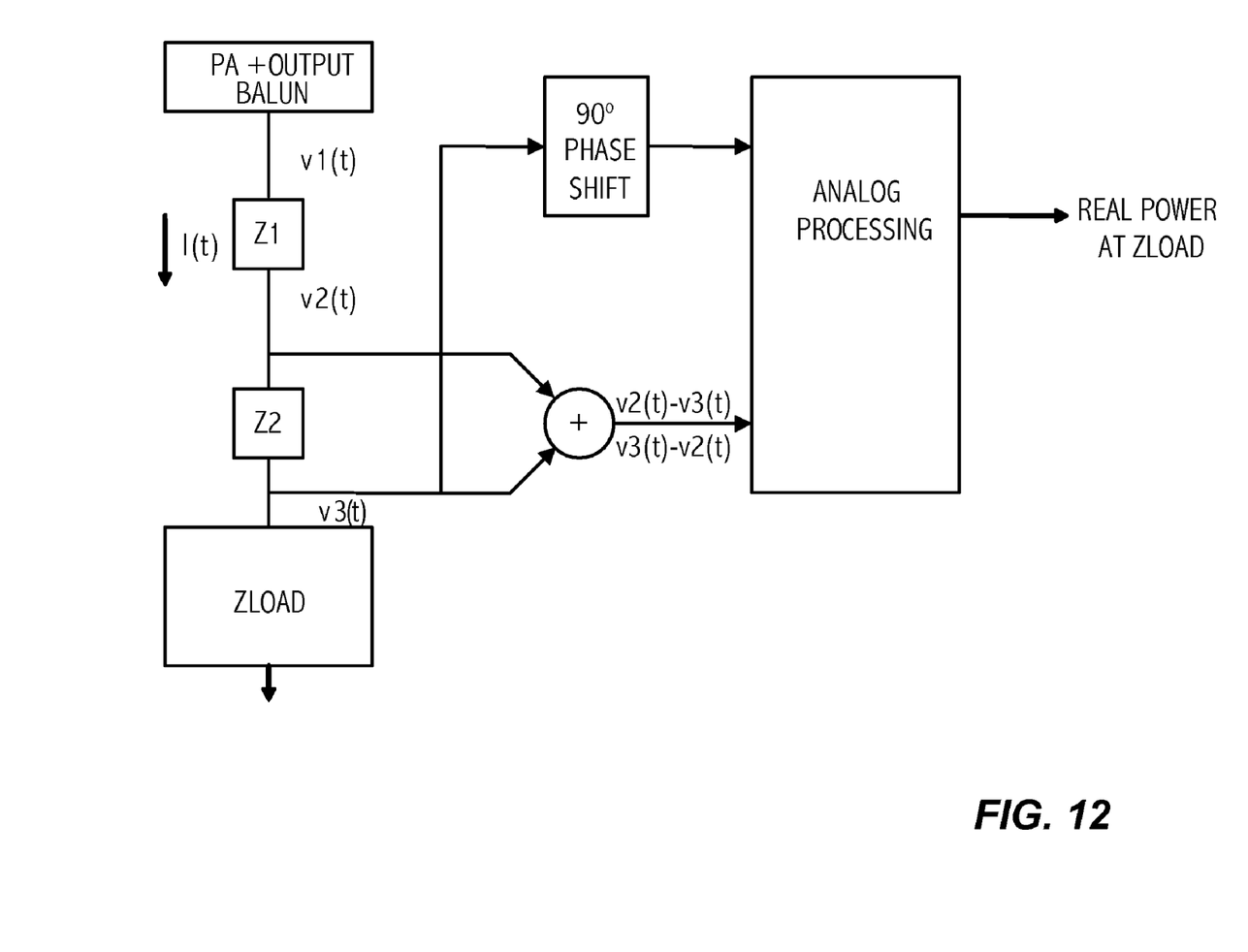
FIG. 12 illustrates an option for selection of the phase delayed voltage and the two other voltages used in determination of real power consumed by the load according to an embodiment of the invention.

In addition, the choice for the v1 and v2 can also be flexible. For example, FIG. 10 shows an embodiment in which v1(t) is supplied to the phase shifter 501 and v2(t)–v3(t) is supplied to the analog processing block 701. FIG. 11 shows an embodiment in which v2(t) is supplied to the phase shifter 501 and v2(t)–v3(t) is supplied to the analog processing block 701. FIG. 12 shows an embodiment in which v3(t) is supplied to the phase shifter 501 and v2(t)–v3(t) is supplied to the analog processing block 701.

Figure 13:
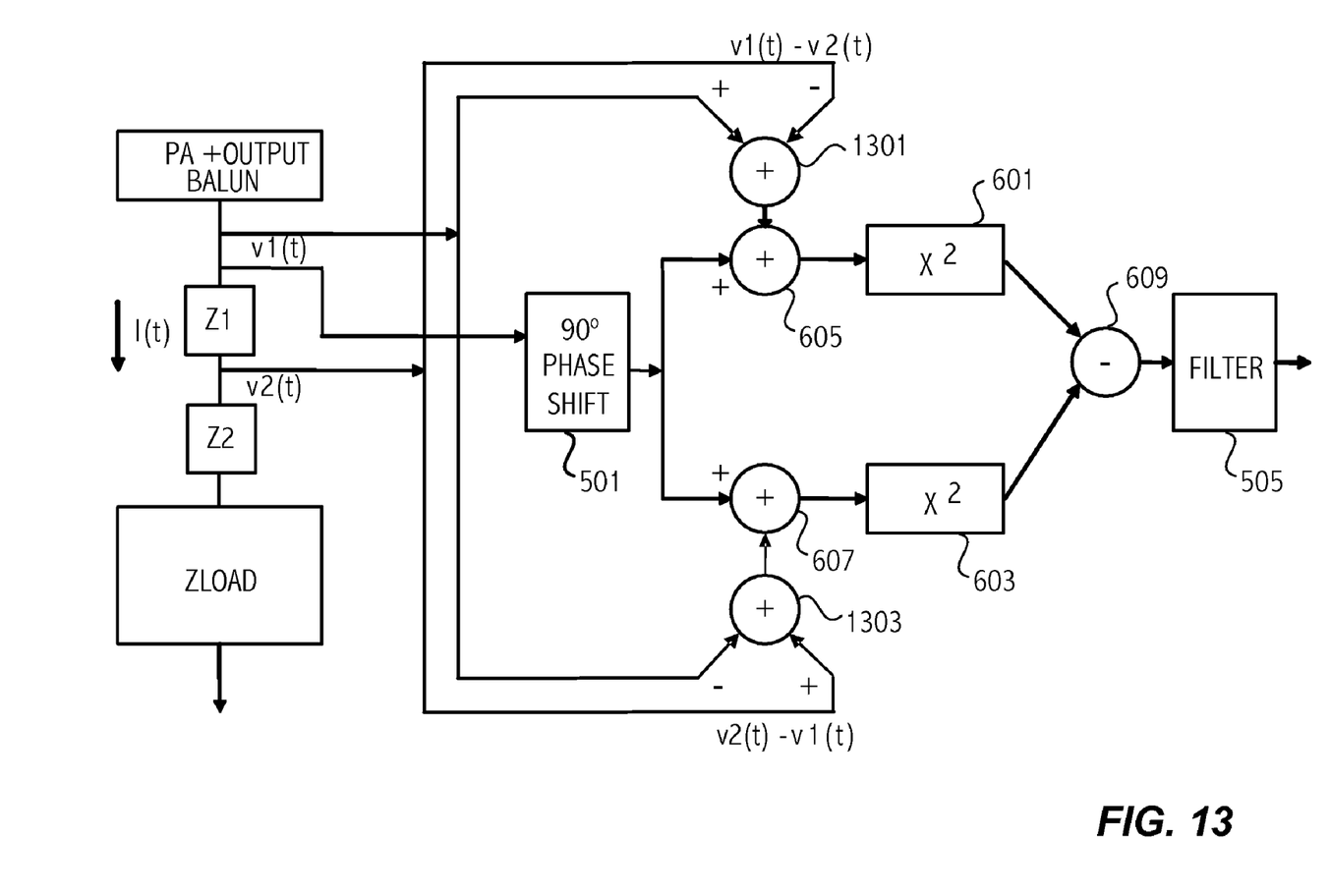
FIG. 13 illustrates additional details of an embodiment of the invention.
Figure 14:
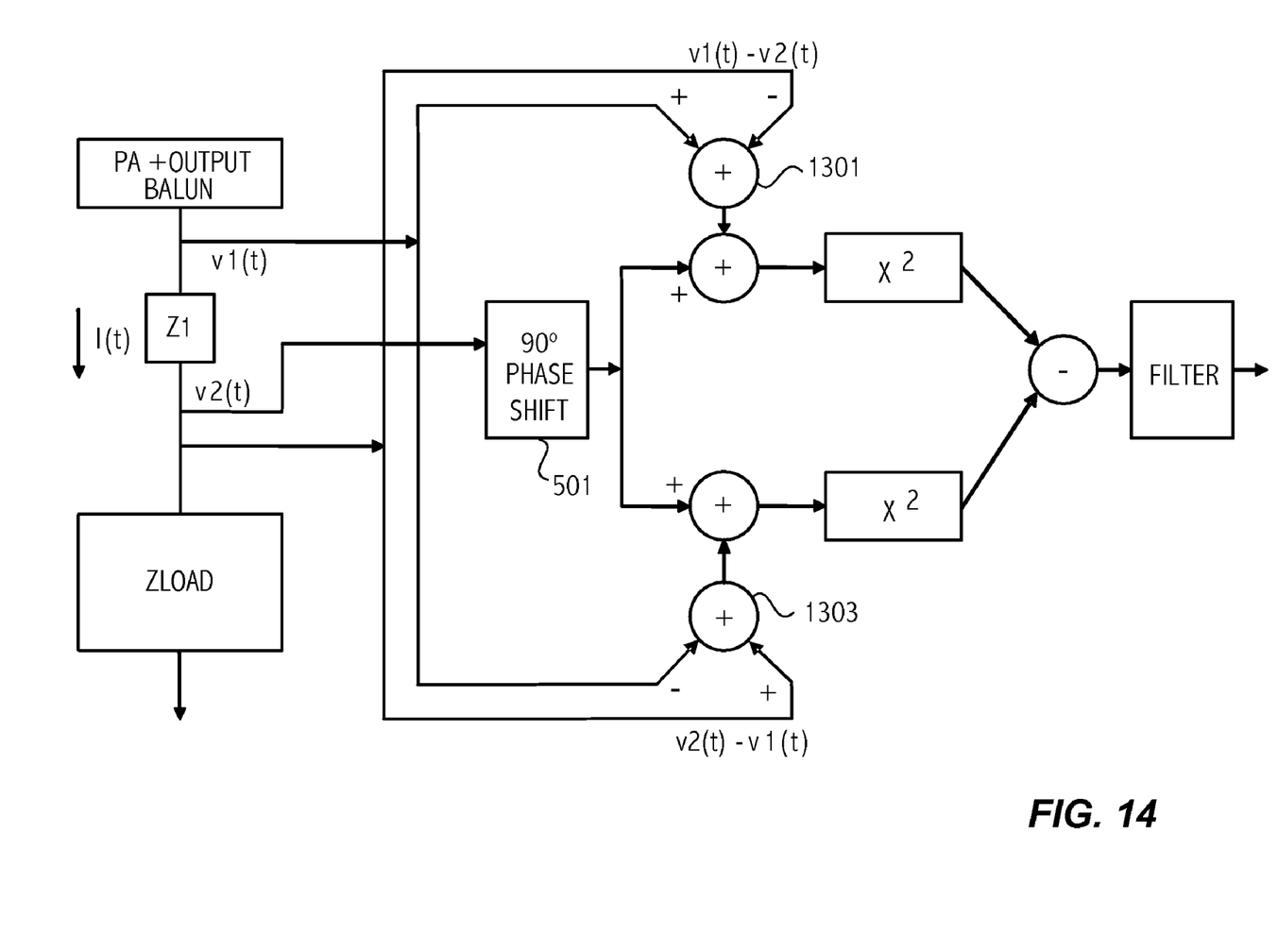
FIG. 14 illustrates additional details of an embodiment of the invention.
Figure 15:
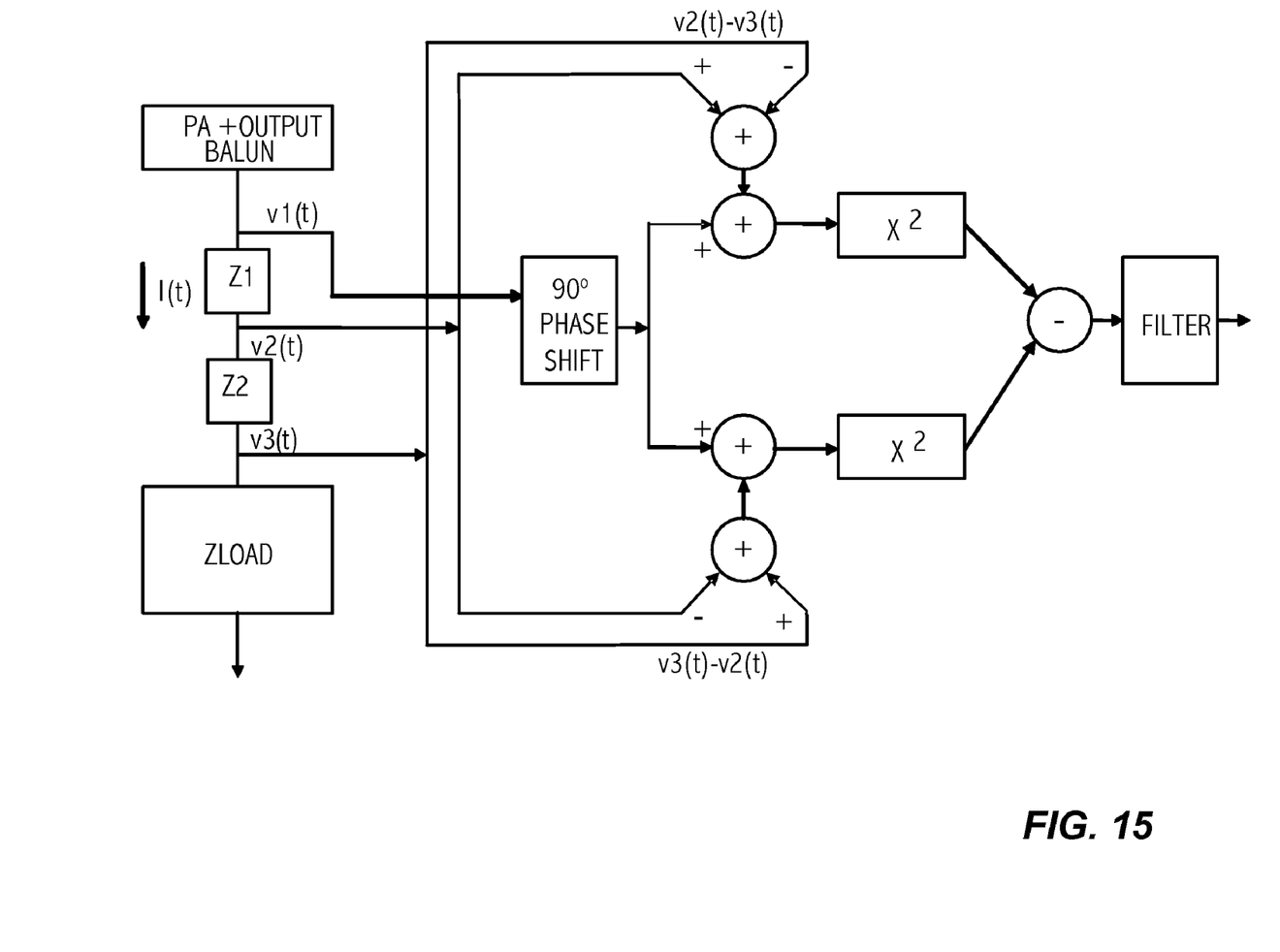
FIG. 15 illustrates additional details of an embodiment of the invention.

Referring to FIG. 13, additional details are shown for the embodiment shown in FIG. 6. More specifically, separate summers 1301 and 1303 are shown, which provide, respectively, v1(t)–v2(t) and v2(t)–v1(t). In another embodiment shown in FIG. 14, v2(t) is supplied to phase shifter 501. FIG. 15 illustrates an embodiment corresponding to FIG. 10.

Referring again to FIG. 3, once the real power is determined, the determined real power at ZLOAD can be provided to the power amplifier stage 315 in FIG. 3 to adjust the output of the power amplifier. In that way better control of the amplifier using the real power consumed by the load impedance can be achieved.

The description of the invention set forth herein is illustrative, and is not intended to limit the scope of the invention as set forth in the following claims. For example, although the RF power amplifier described herein is particularly well suited to power amplifiers built in CMOS, it could also be applied to power amplifiers built in other technologies such as GaAs, SiGe, SOI, and LDMOS. Variations and modifications of the embodiments disclosed herein may be made based on the description set forth herein without departing from the scope of the invention as set forth in the following claims.

What is claimed is:

1. A method comprising:
   measuring real power delivered to a load in an RF transmit path;
   utilizing the measured real power to adjust a power amplifier in the RF transmit path;
   wherein measuring the real power further comprises,
   supplying a first voltage on a first side of a passive network disposed between the power amplifier and the load to a power detector circuit;
   supplying a second voltage on a second side of the passive network to the power detector circuit; and
   using the first and second voltages and a phase shifted voltage to determine the real power delivered to the load.

2. The method as recited in claim 1 further comprising:
   determining a voltage difference between the first and second voltages; and
   determining a multiplication result of the voltage difference multiplied by the phase shifted voltage.

3. The method as recited in claim 2 wherein determining the multiplication result further comprises:
   determining a first RMS value for the phase shifted voltage summed with the voltage difference;
   determining a second RMS value for the phase shifted voltage summed with a negative of the voltage difference; and
   determining a difference between the first RMS value and the second RMS value and providing an RMS difference value as the multiplication result.

4. The method as recited in claim 3 further comprising filtering the RMS difference value in a low pass filter to provide the measured real power.

5. The method as recited in claim 1 wherein the phase shifted voltage is one of the first and second voltages phase shifted.

6. The method as recited in claim 1 wherein the phase shifted voltage is sampled separately from the first and second voltages.

7. An apparatus to determine real power consumed by a load comprising:
   one or more passive networks disposed between a power amplifier and the load in an RF transmit path; and
   a real power detector coupled to the one or more passive networks and configured to utilize a first voltage present on a first side of the one or more passive networks with respect to the power amplifier, and a second voltage present on a second side of the one or more passive networks with respect to the power amplifier, and a phase shifted voltage, to determine the real power consumed by the load.

8. The apparatus as recited in claim 7 further comprising a phase shift circuit coupled to provide the phase shifted voltage to the real power detector.

9. The apparatus as recited in claim 7 wherein the phase shifted voltage is derived from one of the first and second voltages.

10. The apparatus as recited in claim 8 further comprising:
    a difference circuit to determine a voltage difference between the first and second voltages; and
    a circuit to determine a multiplication result of the voltage difference multiplied by the phase shifted voltage.

11. The apparatus as recited in claim 10 further comprising a low pass filter to filter the multiplication result and supply the real power consumed by the load.

12. The apparatus as recited in claim 10 wherein the circuit to determine a multiplication result comprises:
    a first summing circuit to sum a phase shifted third voltage with the voltage difference and generate a first sum;
    a first RMS detect circuit to determine an RMS value for the first sum;
    a second summing circuit to sum the phase shifted third voltage summed with a negative of the voltage difference and generate a second sum;
    a second RMS detect circuit coupled to determine an RMS value for the second sum; and
    a difference circuit coupled to detect a difference between the first RMS value and the second RMS value and provide an RMS difference value as the multiplication result.

13. The apparatus as recited in claim 12 further comprising a filter to filter the multiplication result and provide an indication of the real power consumed by the load.

14. The apparatus as recited in claim 13 wherein the load comprises an antenna.

15. The apparatus as recited in claim 7 wherein the power amplifier configured to adjust its amplification according to the indication of the real power consumed by the load.

16. A method comprising:

supplying a first voltage on a first side of a passive network disposed between the power amplifier and a load in an RF transmit path to a power detector circuit;

supplying a second voltage on a second side of the passive network to the power detector circuit; and determining a voltage difference between the first and second voltages;

phase shifting a voltage to provide a phase shifted voltage; and determining a value of the voltage difference multiplied by the phase shifted voltage.

17. The method as recited in claim 16 further comprising filtering the value of the voltage difference multiplied by the phase shifted voltage to provide real power consumed by the load.

18. The method as recited in claim 16 wherein the phase shifted voltage is based on one of the first and second voltages.

19. The method as recited in claim 16 wherein the phase shifted voltage is based on a voltage separate from the first and second voltages.

20. The method as recited in claim 17 further comprising utilizing the measured real power to adjust the power amplifier in the RF transmit path.

* * * * *

UNITED STATES PATENT AND TRADEMARK OFFICE
CERTIFICATE OF CORRECTION

PATENT NO.       : 8,022,688 B2                                Page 1 of 1
APPLICATION NO.  : 12/366734
DATED            : September 20, 2011
INVENTOR(S)      : Zhoung You It is certified that error appears in the above-identified patent and that said Letters Patent is hereby corrected as shown below:

Col. 6, line 52, please delete "coupled"
    Col. 6, line 54, please delete "coupled"
    Col. 6, line 66, please replace "amplifier configured" with --amplifier is configured--.

Signed and Sealed this
Seventeenth Day of January, 2012

David J. Kappos
*Director of the United States Patent and Trademark Office*